United States Patent
Higuma et al.

(10) Patent No.: US 8,636,873 B2
(45) Date of Patent: Jan. 28, 2014

(54) PLASMA PROCESSING APPARATUS AND STRUCTURE THEREIN

(75) Inventors: Masakazu Higuma, Nirasaki (JP); Shinji Muto, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 1413 days.

(21) Appl. No.: 12/046,723

(22) Filed: Mar. 12, 2008

(65) Prior Publication Data

US 2008/0230181 A1  Sep. 25, 2008

Related U.S. Application Data

(60) Provisional application No. 60/941,832, filed on Jun. 4, 2007.

(30) Foreign Application Priority Data

Mar. 19, 2007 (JP) .................................. 2007-070370

(51) Int. Cl.
*C23F 1/00* (2006.01)
*H01L 21/306* (2006.01)
*C23C 16/00* (2006.01)

(52) U.S. Cl.
USPC ...................................... 156/345.51; 118/728

(58) Field of Classification Search
USPC ............................ 118/715, 728; 156/345.51
See application file for complete search history.

(56) References Cited

U.S. PATENT DOCUMENTS

| 5,557,215 A | 9/1996 | Saeki et al. |
| 2005/0105243 A1* | 5/2005 | Lee et al. ..................... 361/234 |

FOREIGN PATENT DOCUMENTS

| JP | 5-31239 A | 2/1993 |
| JP | 5-53239 A | 3/1993 |
| JP | 10-068058 | 3/1998 |
| JP | 11-233602 A | 8/1999 |
| JP | 2004-31665 | 1/2004 |
| TW | 257872 | 9/1995 |

* cited by examiner

*Primary Examiner* — Maureen Gramaglia
(74) *Attorney, Agent, or Firm* — Rothwell, Figg, Ernst & Manbeck, P.C.

(57) ABSTRACT

A structure, for use in a processing chamber of a plasma processing apparatus in which a plasma process is performed on a target substrate, includes a base member at least having a first surface and a second surface; and a thermally sprayed insulating film covering the first surface. Further, the structure includes an insulating protection member covering the second surface and made of a material having a linear expansion coefficient different from that of the base member; and an insulating layer interposed between the thermally sprayed insulating film and the insulating protection member to prevent a contact therebetween. The thermally sprayed insulating film, the insulating protection member and the insulating layer constitute an insulating surface covering the first surface and the second surface.

10 Claims, 3 Drawing Sheets

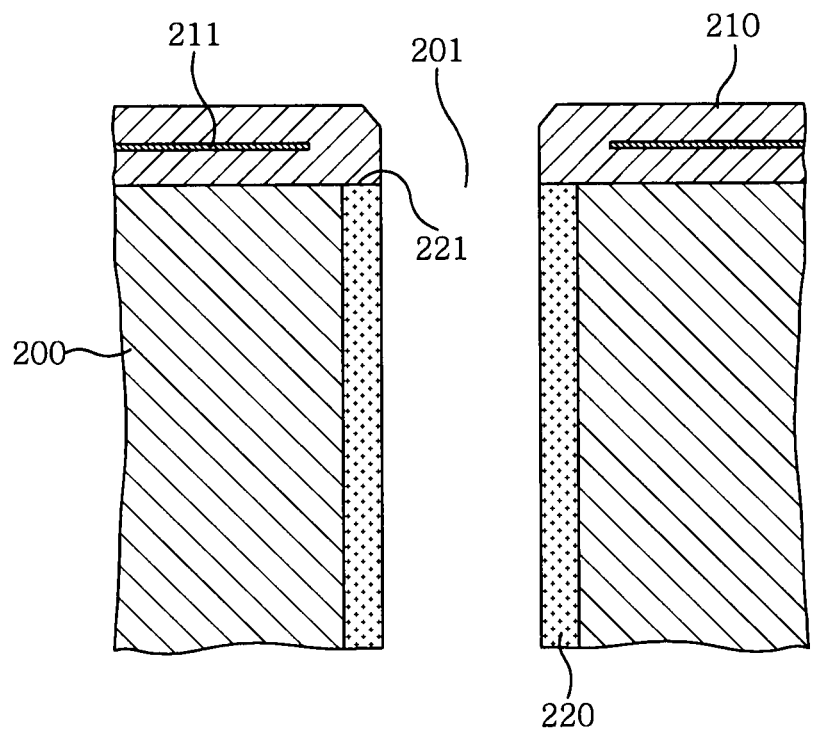

PLASMA PROCESSING APPARATUS AND STRUCTURE THEREIN

FIELD OF THE INVENTION

The present invention relates to a plasma processing apparatus for performing a plasma process such as plasma etching, plasma CVD (Chemical Vapor Deposition) or the like on a target substrate such as a semiconductor wafer, an LCD (Liquid Crystal Display) glass substrate, or the like; and a structure inside the plasma processing apparatus.

BACKGROUND OF THE INVENTION

Conventionally, in the field of manufacture of semiconductor devices, LCD devices and the like, there has been used a plasma processing apparatus for performing plasma etching or plasma CVD by generating a plasma. In such plasma processing apparatus, the plasma is generated by creating a depressurized atmosphere in a processing chamber, wherein an electrostatic chuck has been widely employed as means for sustaining a target substrate in the vacuum chamber.

As the aforementioned electrostatic chuck, there is known one having an electrode embedded in an insulating film, wherein a thermally sprayed film is used as the insulating film. Further, there is also known a technique that employs a spray material containing a substance whose volume is expanded when it is thermally sprayed on a base member such as copper-based powder that undergoes a martensite transformation, thereby enhancing the adhesivity of the thermally sprayed material to the base member, while preventing it from being detached therefrom (see, for example, Japanese Patent Laid-open Application No. H10-68058: Patent Reference 1).

FIG. 4 provides an enlarged configuration view of major parts of such an electrostatic chuck. Reference numeral 200 denotes a base member made of aluminum or the like. A thermally sprayed insulating film 210 is formed on the top surface (mounting surface for mounting a target substrate thereon) of the base member 200, and an electrostatic chuck electrode 211 is embedded in the thermally sprayed film 210. Further, the base member 200 is provided with a circular hole 201 through which a lifter pin (not shown), which serves as a substrate supporting member for sustaining the target substrate on the mounting surface, is installed, and cylindrical sleeves 220 made of insulating ceramic or the like are provided inside the circular hole 201. The sleeves 220 cover the inside of the circular hole 201 to insulate it and serve to prevent the lifter pin from rubbing against the inner surface of the circular hole 201 to thereby suppress dusts being generated when it is moved up and down.

In such a substrate mounting structure having the configuration shown in FIG. 4 for use in the plasma processing apparatus, the temperature of the base member 200 is controlled by means of a temperature control mechanism so that the temperature of the target substrate mounted on the substrate mounting structure is regulated at a desired temperature level suitable for a plasma process. Recently, some plasma processes are performed at a high temperature of, for example, 100° C. or higher. If the plasma process is performed at such a high temperature, however, the thermally sprayed film 210 can be damaged, resulting in a failure of the insulation of the electrostatic chuck 211 or the base member 200. As a result, an electric discharge or the like can be caused.

SUMMARY OF THE INVENTION

In view of the foregoing, the present invention provides a plasma processing apparatus and a structure therein, capable of suppressing damage to a thermally sprayed film even when a plasma process is performed at a high temperature, thereby preventing an occurrence of an electric discharge due to an insulation failure.

In accordance with a first aspect of the present invention, there is provided a structure for use in a processing chamber of a plasma processing apparatus, wherein in the processing chamber, a plasma process is performed on a target substrate by a plasma. The structure includes: a base member at least having a first surface and a second surface; a thermally sprayed insulating film covering the first surface; an insulating protection member covering the second surface and made of a material having a linear expansion coefficient different from that of the base member; and a buffering surface covered with an insulating layer interposed between the thermally sprayed insulating film and the insulating protection member to prevent a contact therebetween. The thermally sprayed insulating film, the insulating protection member and the insulating layer constitute an insulating surface covering the first surface and the second surface.

It is preferable that the insulating layer is made of an oxide of the base member.

The first surface may be a mounting surface for mounting the target substrate thereon.

The second surface may be an inner surface of a hole provided in the mounting surface, and the protection member may be a cylindrical member covering the inner surface of the hole.

Further, a vertically movable substrate supporting member for sustaining the target substrate above the mounting surface may be disposed in the hole.

Further, it is preferable that the buffering is provided at the second surface.

It is also preferable that an electrode for electrostatically attracting the target substrate is embedded in the thermally sprayed insulating film.

Further, it is preferable that the base member is conductive and serves as an electrode for the plasma process.

In accordance with a second aspect of the present invention, there is provided a structure for use in a processing chamber of a plasma processing apparatus, wherein in the processing chamber, a plasma process is performed on a target substrate by a plasma. The structure includes: a base member whose top surface serves as a mounting surface for mounting thereon the target substrate, wherein the base member is made of a conductive material and, at the mounting surface, the base member is provided with a through hole through which a substrate supporting member is disposed to be movable vertically up and down, a thermally sprayed insulating film covering the mounting surface; a cylindrical insulating protection member covering an inner surface of the through hole, a top end of the protection member being arranged to be positioned below the mounting surface by a predetermined distance, and the protection member being made of a material having a linear expansion coefficient different from that of the base member; and an insulating layer covering a portion of the inner surface of the through hole located above the top end of the protection member.

In accordance with a third aspect of the present invention, there is provided a plasma processing apparatus including the structure of the first or the second aspect of the present invention.

In accordance with the present invention, it is possible to provide a plasma processing apparatus and a structure therein, capable of preventing damage to a thermally sprayed film even when a plasma process is performed at a high temperature, thereby suppressing an occurrence of an electric discharge due to an insulation failure.

BRIEF DESCRIPTION OF THE DRAWINGS

The above and other features of the present invention will become apparent from the following description of an embodiment given in conjunction with the accompanying drawings, in which:

FIG. 4 depicts an enlarged configuration view showing major parts of a plasma etching apparatus in accordance with a comparative example.

DETAILED DESCRIPTION OF THE EMBODIMENT

Figure 1:
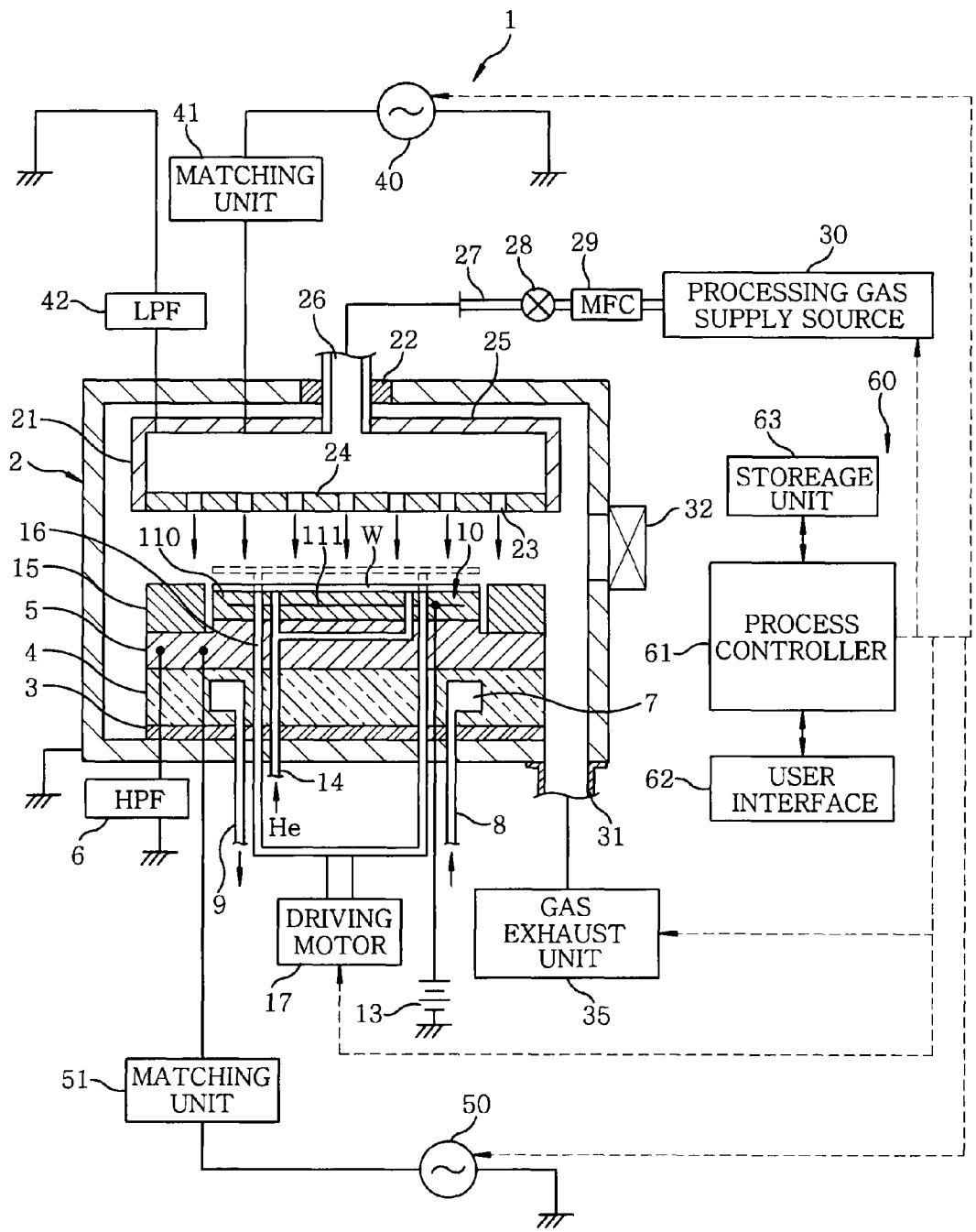
FIG. 1 is a schematic cross sectional configuration view of a plasma etching apparatus in accordance with an embodiment of the present invention.

Hereinafter, an embodiment of the present invention will be described with reference to the accompanying drawings which form a part hereof. FIG. 1 schematically illustrates a cross sectional configuration of a plasma etching apparatus 1 which is employed as a plasma processing apparatus in accordance with the embodiment of the present invention.

The plasma etching apparatus 1 is configured as a capacitively coupled parallel plate type etching apparatus including an upper and a lower electrode disposed to face each other in parallel and respectively connected to power supplies for plasma generation.

The plasma etching apparatus 1 has a cylindrical processing chamber (processing vessel) 2 formed of, for example, aluminum whose surface is anodically oxidized, wherein the processing chamber 2 is grounded. A substantially columnar susceptor support 4 for mounting thereon a target substrate to be processed, e.g., a semiconductor wafer W is installed at a bottom portion of the processing chamber 2 via an insulating plate 3 such as ceramic. Further, a susceptor 5 serving as a lower electrode is mounted on the susceptor support 4, wherein the susceptor 5 is connected to a high pass filter (HPF) 6.

A temperature control medium path 7 is formed inside the susceptor support 4, and a temperature control medium is introduced into the temperature control medium path 7 via a temperature control medium introducing line 8 and is discharged via a temperature medium exhaust line 9. By the circulation of the temperature control medium, heat is transferred between the temperature control medium and the semiconductor wafer W via the susceptor 5, whereby the semiconductor wafer W is maintained at a desired temperature level.

The susceptor 5 is of a disk shape with an upper central portion protruded higher than its peripheral portion, and an electrostatic chuck 10 that is shaped substantially identical to the semiconductor wafer W is disposed on the upper central portion of the susceptor 5. The electrostatic chuck 10 includes an electrode 111 embedded in a thermally sprayed film 110 serving as an insulating layer. The electrostatic chuck 10 attracts and holds the semiconductor wafer W thereon by, for example, a Coulomb force generated by a DC voltage of, for example, 1.5 kV applied to the electrode 111 from a DC power supply 13 connected thereto.

Further, formed through the insulating plate 3, the susceptor support 4, the susceptor 5 and the electrostatic chuck 10 is a gas channel 14 for supplying a heat transfer medium (for example, a He gas or the like) to the rear surface of the semiconductor wafer W. Thus, the heat of the susceptor 5 is transferred to the semiconductor wafer W through the heat transfer medium, so that the wafer W is maintained at the desired temperature level.

An annular focus ring 15 is disposed on the periphery of the top surface of the susceptor 5 to surround the semiconductor wafer W loaded on the electrostatic chuck 10. The focus ring 15 is formed of a conductive material such as silicon and serves to improve uniformity of etching.

Provided through the insulating plate 3, the susceptor support 4, the susceptor 5 and the electrostatic chuck 10 is a plurality of (for example, three) lifter pins 16 which are configured to be vertically movable by a driving motor 17. When the lifter pins 16 are lowered, their top portions are hidden inside the susceptor 5, whereas when the lifter pins are raised, their top portions protrude above the susceptor 5 as indicated with dashed lines in FIG. 1, thereby sustaining the semiconductor wafer W above the susceptor 5. Accordingly, the semiconductor wafer W can be transferred from or to a wafer transfer arm (not shown).

An upper electrode 21 is disposed above the susceptor 5 to face it in parallel. The upper electrode 21 is supported at an upper portion of the processing chamber 2 via an insulating member 22. The upper electrode 21 includes an electrode plate 24 and an electrode support 25 that serves to support the electrode 24 and is made of a conductive material. The electrode plate 24 is configured to face the susceptor 5 and is provided with a number of injection openings 23. The electrode plate 24 is formed of, for example, silicon or aluminum whose surface is anodically oxidized (alumite treated) with a quartz cover attached thereto. A distance between the susceptor 5 and the upper electrode 21 is variable.

A gas inlet port 26 is formed at a center of the electrode support 25 of the upper electrode 21, and a gas supply line 27 is coupled to the gas inlet port 26. Further, the gas supply line 27 is connected to a processing gas supply source 30 via a valve 28 and a mass flow controller 29. The processing gas supply source 30 supplies an etching gas as a processing gas.

A gas exhaust line 31 is connected to a bottom portion of the processing chamber 2 and a gas exhaust unit 35 is connected to the gas exhaust line 31. The gas exhaust unit 35 includes a vacuum pump such as a turbo molecular pump, and serves to create a depressurized atmosphere in the processing chamber 2, i.e., to evacuate the chamber 2 such that the inner pressure thereof is reduced down to a specific vacuum level, e.g., 1 Pa or less. Further, a gate valve 32 is installed at a sidewall of the processing chamber 2. The semiconductor wafer W is transferred between the processing chamber 2 and an adjacent load lock chamber (not shown) while the gate valve 32 is opened.

A first high frequency power supply 40 is connected to the upper electrode 21 via a matching unit 41. Further, a low pass filter (LPF) 42 is connected to the upper electrode 21. The first high frequency power supply 40 is of a frequency ranging from about 50 to 150 MHz. By applying a high frequency power in such a frequency range, a high-density plasma in a desirable dissociated state can be generated in the processing chamber 2.

Further, a second high frequency power supply 50 is connected to the susceptor 5 serving as the lower electrode via a matching unit 51. The second high frequency power supply 50 has a frequency range lower than that of the first high frequency power supply 40. By applying a power of a frequency in such a range, a proper ionic action can be facilitated without causing damage on the semiconductor wafer W being processed. Preferably, the frequency of the second high frequency power supply 50 is determined within a range from about 1 to 20 MHz.

The whole operation of the plasma etching apparatus 1 having the above-described configuration is controlled by a control unit 60. The control unit 60 includes a process controller 61 having a CPU for controlling each component of the plasma etching apparatus 1; a user interface 62; and a storage unit 63.

The user interface 62 includes a keyboard for a process manager to input a command to operate the plasma etching apparatus 1, a display for showing an operational status of the plasma etching apparatus 1, and the like.

Moreover, the storage unit 63 stores therein recipes including control programs (software), processing condition data, and the like to be used in realizing various processes, which are performed in the plasma etching apparatus 1 under the control of the process controller 61. When a command is received from the user interface 62, a necessary recipe is retrieved from the storage unit 63 to be executed by the process controller 61, whereby a desired process is performed in the plasma etching apparatus 1 under the control of the process controller 61. The necessary recipe can be retrieved from a computer-readable storage medium (for example, a hard disk, a CD, a flexible disk, a semiconductor memory, and the like), or can be used on-line by being transmitted from another apparatus via, e.g., a dedicated line, whenever necessary.

Figure 2:
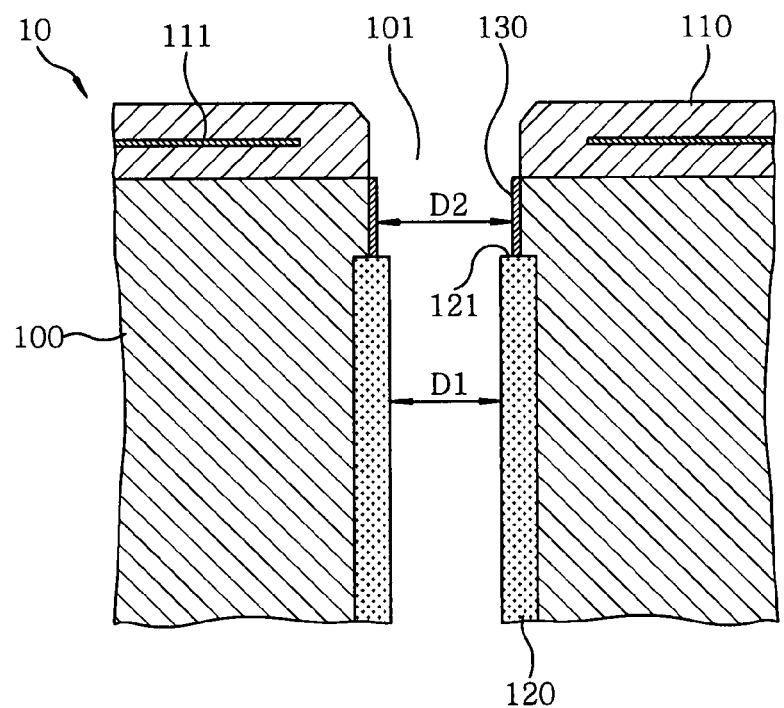
FIG. 2 sets forth an enlarged configured view showing major parts of the plasma etching apparatus shown in FIG. 1.
Figure 3:
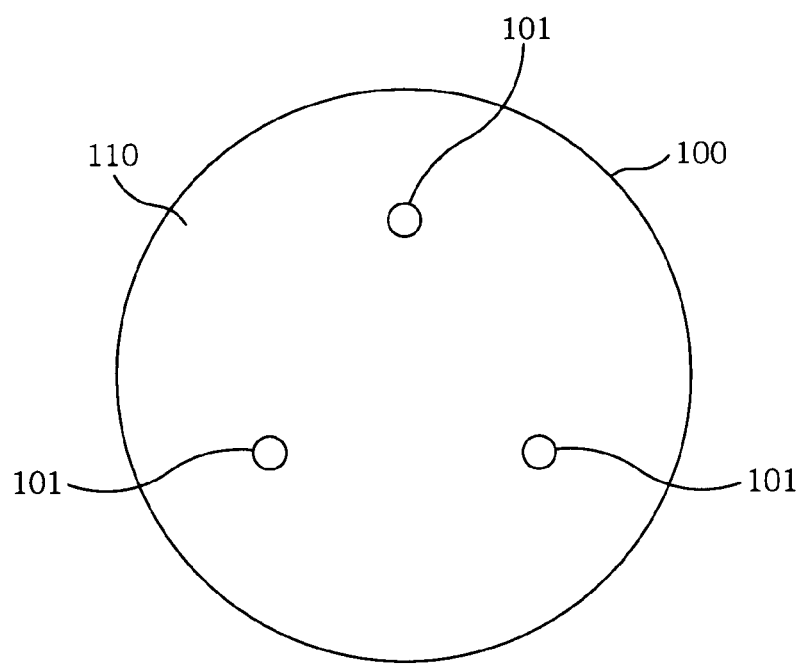
FIG. 3 presents a configuration view showing major parts of the plasma etching apparatus shown in FIG. 1.

FIG. 2 sets forth an enlarged view showing major components of the susceptor 5 of the above-described plasma etching apparatus 1. In FIG. 2, reference numeral 100 is a base member made of a conductive material such as aluminum. A thermally sprayed insulating film 110 made of, for example, alumina, yttrium oxide or the like is formed on a top surface (mounting surface for mounting thereon a target substrate) of the base member 100, and an electrostatic chuck electrode 111 is embedded in the thermally sprayed film 110. The electrostatic chuck electrode 111 can be formed by, for example, thermally spraying a conductive material. Further, the base member 100 is provided with a plurality of circular holes 101, and lifter pins 16 (not shown in FIG. 2), which serve as a substrate supporting member for supporting a target substrate as shown in FIG. 1, are disposed through the circular holes 101. Inside each circular hole 101, there is provided a cylindrical sleeve 120 made of insulating ceramic (for example, alumina, aluminum nitride, and the like), resin (for example, polyimide based resin), or the like. As shown in FIG. 3, there is provided a plurality of the circular holes 101, i.e., three, for example.

In this embodiment, a top end portion 121 of the sleeve 120 is located at a certain distance from the top of the circular hole 101 lest the sleeve 120 should contact the thermally sprayed film 110. Further, an insulating layer 130, for example, an anodic oxide film (alumite film), is formed on an inner wall portion of the circular hole 101 above the top end portion 121 of the circular hole 101. This insulating layer 130 located at the upper end portion of the inside of the circular hole 101 serves as a buffering surface between the sleeve 120 and the thermally sprayed film 110. An insulating surface covering the top surface (first surface) of the base member 100 and the inner surface (first surface) of the circular hole 101 includes the thermally sprayed film 110, the sleeve 120 and the insulating layer 130.

The sleeve 120 insulates the inside of the circular hole 101 and functions to prevent the lifter pins shown in FIG. 1 from rubbing against the inner surface of the circular hole 101 while the lifter pins 16 are moving up and down, thus preventing a particle generation. That is, in the event that the inner surface of the circular hole 101 is insulated by, for example, an anodic oxide film exposed thereon, there is a high likelihood that the lifter pins 16 rub against the anodic oxide film while it is moving up and down, thereby causing the anodic oxide film to be peeled off. In this regard, by forming the sleeve 120 such that its inner diameter D1 (for example, 3.4 mm) is smaller than an inner diameter D2 (for example, 4.0 mm) of the buffering surface portion on which the insulating film 130 is formed, the contact between the insulating layer 130 and the lifter pin 15 is prevented.

As described above, the buffering surface having the insulating layer 130 thereon is provided to prevent a contact between the thermally sprayed film 110 and the sleeve 120 in accordance with the embodiment of the present invention. Accordingly, even in case the temperature of the base member 100 is set high, for example, 100° C. or higher, it can be prevented that a stress is imposed on the thermally sprayed film 110 due to a difference between the linear expansion coefficient of the base member 100 and that of the sleeve 120.

In contrast, in case a thermally sprayed film 210 is formed up to a top end portion 221 of a sleeve 220 as illustrated in FIG. 4, a stress would be applied to the thermally sprayed film 210 formed on a base member 200 and a sleeve 220 due to a difference between their linear expansion coefficients. As a result, the thermally sprayed film 210 is likely to be damaged. In the event that the base member 200 is made of aluminum and the sleeve 220 is made of alumina, the linear expansion coefficient of the base member 200 is about $23 \times 10^{-6}$, which is three times as great as the linear expansion coefficient of the sleeve 220 which is about $7 \times 10^{-6}$.

For each of the structure in accordance with the present embodiment shown in FIG. 2 and the structure in accordance with the comparative example shown in FIG. 4, a test was conducted wherein the temperature of the base members was raised and cooled down to the room temperature, and it was investigated whether a crack was generated in the thermally sprayed films in both cases. The test result is provided in Table 1. The temperature was raised by 5° C. from 110° C., and 6 samples in accordance with the present embodiment and 6 samples in accordance with the comparative example were tested. In Table 1, "O" indicates that there was no crack developed, while "X" informs that there was a crack generated. For a sample that experienced the crack generation, a test at a higher temperature degree was no more conducted.

TABLE 1

|  | Embodiment | | | | | | Comparative Example | | | | | |
| --- | --- | --- | --- | --- | --- | --- | --- | --- | --- | --- | --- | --- |
|  | 1 | 2 | 3 | 4 | 5 | 6 | 1 | 2 | 3 | 4 | 5 | 6 |
| 110° C. | O | O | O | O | O | O | O | O | O | O | O | O |
| 115° C. | O | O | O | O | O | O | O | O | O | O | O | O |
| 120° C. | O | O | O | O | O | O | X | O | O | X | X | O |
| 125° C. | O | O | O | O | O | O | — | X | X | — | — | X |
| 130° C. | O | O | O | O | O | O | — | — | — | — | — | — |
| 135° C. | O | O | O | O | O | O | — | — | — | — | — | — |
| 140° C. | O | O | O | O | O | O | — | — | — | — | — | — |
| 145° C. | O | O | O | O | O | O | — | — | — | — | — | — |
| 150° C. | O | O | O | O | O | O | — | — | — | — | — | — |

As can be seen from Table 1, in each sample in accordance with the present embodiment, no crack generation was observed up to the temperature degree of 150° C. In each sample of the comparative example, however, cracks were generated when the temperature was raised from 120° C. to 125° C. This test result reveals that the heat resistance of the thermally sprayed film in accordance with the present embodiment is improved in comparison to that of the comparative example. Accordingly, even in case a high temperature treatment is performed, a damage to the thermally sprayed film can be avoided, so that an insulation failure due to the damage to the thermally sprayed film and a generation of an electric discharge due to the insulation failure can be prevented.

Now, a process of performing a plasma etching on a semiconductor wafer, that is performed by using the plasma etching apparatus 1 having the above-described configuration, will be explained. First, after the gate valve 32 is opened, the semiconductor wafer W is loaded into the processing chamber 2 from a load lock chamber (not shown) and is mounted on the lifter pins 16. Then, the lifter pins 16 are lowered, and the semiconductor wafer W is placed on the electrostatic chuck 10. Subsequently, the gate valve 32 is closed, and the processing chamber 2 is evacuated to a specific vacuum level by the gas exhaust unit 35. Thereafter, by applying a DC voltage to the electrostatic chuck 10 from the DC power supply 13, the semiconductor wafer W is attracted to the electrostatic chuck 10 to be firmly held thereon.

Then, the valve 28 is opened, and a processing gas (etching gas) is introduced from the processing gas supply source 30 into a hollow space inside the upper electrode 21 via the gas supply line 27 and the gas inlet port 26, while its flow rate is being controlled by the mass flow controller (MFC) 29, and is uniformly discharged toward the semiconductor wafer W as illustrated by arrows in FIG. 1.

The internal pressure of the processing chamber 2 is kept at a preset level. Thereafter, a high frequency power in a specific frequency range is applied from the first high frequency power supply 40 to the upper electrode 21. As a result, a high frequency electric field is generated between the upper electrode 21 and the susceptor 5 serving as the lower electrode, whereby the processing gas dissociates and is converted into a plasma.

Meanwhile, a high frequency power of a frequency lower than that from the first frequency power supply 40 is applied from the second high frequency power supply 50 to the susceptor 5 serving as the lower electrode. As a result, ions in the plasma are attracted toward the susceptor 5, so that etching anisotropy improves by ion assist.

Then, upon the completion of the plasma etching, the high frequency powers and the processing gas are stopped to be supplied, and the semiconductor wafer W is unloaded from the processing chamber 2 in the reverse sequence to that described above.

In accordance with the present invention as described above, it is possible to provide a plasma processing apparatus and a structure for use therein capable of suppressing a damage to a thermally sprayed film even in case a plasma process is performed at a high temperature. Furthermore, it is to be noted that the present invention can be modified in various ways without being limited to the above-described embodiment.

For example, the plasma etching apparatus is not limited to the parallel plate type etching apparatus in which high frequency powers are applied to both of the upper and the lower electrode, but it can be of a type which applies dual frequency powers to the lower electrode, or even other types. Moreover, though the above embodiment has been described for the case of applying the present invention to the mounting surface of the susceptor and the circular hole portions for accommodating the lifter pins, the present invention is not limited to this embodiment, but it can be applied to various other structures for a plasma processing apparatus.

While the invention has been shown and described with respect to the embodiment, it will be understood by those skilled in the art that various changes and modifications may be made without departing from the scope of he invention as defined in the following claims.

What is claimed is:

1. A mounting table for mounting a target substrate, the mounting table comprising:
    a base member at least having a first surface, a second surface and a third surface;
    an electrostatic chuck provided on the first surface; and
    a hole formed through the base member and the electrostatic chuck and in which a lifter pin exposed to the second surface and the third surface is inserted, an inner surface of the hole including the second and the third surface,
    wherein a thermally sprayed insulating film is formed on the first surface, an insulating sleeve made of a material having a linear expansion coefficient different from that of the base member is provided on the second surface of the hole, and the third surface is covered with an insulating layer,
    wherein an inner diameter of the third surface is larger than that of the second surface, and
    wherein the insulating layer is interposed between the thermally sprayed insulating film and the insulating sleeve to prevent a contact therebetween, and is configured to prevent a stress from being imposed on the thermally sprayed insulating film due to the difference between the linear expansion coefficient of the base member and that of the insulating sleeve.

2. The mounting table of claim 1, wherein the second surface is a part of the inner surface of the hole formed through the base member and the insulating sleeve is a cylindrical member covering the second surface of the hole.

3. The mounting table of claim 1, wherein the insulating layer is an anodic oxide film.

4. The mounting table of claim 1, wherein the insulating sleeve is alumina, aluminum nitride or resin.

5. The mounting table of claim 1, wherein the insulating protection member has a first thickness, and the insulating layer has a second thickness smaller than the first thickness.

6. A plasma processing apparatus comprising:
    a processing chamber for processing a target substrate;
    a mounting table for mounting the target substrate;
    a gas exhaust line connected to a gas exhaust unit for evacuating the processing chamber with a vacuum pump; and
    a gas inlet port for introducing a gas into the processing chamber,
    wherein the mounting table comprising:
    a base member at least having a first surface, a second surface and a third surface;
    an electrostatic chuck provided on the first surface; and
    a hole formed through the base member and the electrostatic chuck and in which a lifter pin exposed to the second surface and the third surface is inserted, an inner surface of the hole including the second and the third surface,
    wherein a thermally sprayed insulating film is formed on the first surface, an insulating sleeve made of a material having a linear expansion coefficient different from that of the base member is provided on the second surface of the hole, and the third surface is covered with an insulating layer, wherein an inner diameter of the third surface is larger than that of the second surface, and wherein the insulating layer is interposed between the thermally sprayed insulating film and the insulating sleeve to prevent a contact therebetween, and is configured to prevent a stress from being imposed on the thermally sprayed insulating film due to the difference between the linear expansion coefficient of the base member and that of the insulating sleeve.

7. The plasma processing apparatus of claim 6, wherein the mounting table includes a lower electrode and the plasma processing apparatus further comprises an upper electrode having the gas inlet port.

8. The plasma processing apparatus of claim 6, wherein the insulating layer is an anodic oxide film.

9. The plasma processing apparatus of claim 6, wherein the insulating sleeve is alumina, aluminum nitride or resin.

10. The plasma processing apparatus of claim 6, wherein the insulating protection member has a first thickness, and the insulating layer has a second thickness smaller than the first thickness.

* * * * *